United States Patent
Ku

(10) Patent No.: US 9,384,800 B2
(45) Date of Patent: Jul. 5, 2016

(54) SEMICONDUCTOR DEVICE AND SEMICONDUCTOR SYSTEM HAVING THE SAME

(71) Applicant: SK hynix Inc., Gyeonggi-do (KR)

(72) Inventor: Young-Jun Ku, Gyeonggi-do (KR)

(73) Assignee: SK Hynix Inc., Gyeonggi-do (KR)

(*) Notice: Subject to any disclaimer, the term of this patent is extended or adjusted under 35 U.S.C. 154(b) by 43 days.

(21) Appl. No.: 14/107,927

(22) Filed: Dec. 16, 2013

(65) Prior Publication Data
US 2015/0023119 A1    Jan. 22, 2015

(30) Foreign Application Priority Data

Jul. 16, 2013    (KR) .................. 10-2013-0083631

(51) Int. Cl.
| | | |
|---|---|---|
| G11C 7/00 | (2006.01) | |
| G11C 7/12 | (2006.01) | |
| G11C 7/22 | (2006.01) | |
| G11C 7/10 | (2006.01) | |
| G11C 8/12 | (2006.01) | |
| G11C 11/4076 | (2006.01) | |
| G11C 11/408 | (2006.01) | |
| G11C 11/4094 | (2006.01) | |

(52) U.S. Cl.
CPC ........ *G11C 7/12* (2013.01); *G11C 7/109* (2013.01); *G11C 7/22* (2013.01); *G11C 7/222* (2013.01); *G11C 8/12* (2013.01); *G11C 11/4076* (2013.01); *G11C 11/4087* (2013.01); *G11C 11/4094* (2013.01)

(58) Field of Classification Search
USPC .......................................................... 365/203
See application file for complete search history.

(56) References Cited

U.S. PATENT DOCUMENTS 6,330,636 B1 * 12/2001 Bondurant ........... G11C 7/1066
                                                              711/101
2013/0238841 A1 * 9/2013 Kim .................... G06F 12/0246
                                                              711/103

FOREIGN PATENT DOCUMENTS

KR    1020110045394    5/2011

* cited by examiner

*Primary Examiner* — Huan Hoang
*Assistant Examiner* — Pablo Huerta
(74) *Attorney, Agent, or Firm* — IP & T Group LLP

(57) ABSTRACT

A semiconductor device includes a column command generation unit suitable for generating a column command delayed by a first delay time from a source command, in response to a first control signal and the source command, a bank address generation unit suitable for generating a bank address delayed by the first delay time from a bank source address, in response to the first control signal and the bank source address, a precharge command generation unit suitable for generating a precharge command delayed by a second delay time from the column command, in response to a second control signal and the column command, and a precharge bank address generation unit suitable for generating a precharge bank address delayed by the second delay time from the bank address, in response to the second control signal and the bank address.

20 Claims, 12 Drawing Sheets

SEMICONDUCTOR DEVICE AND SEMICONDUCTOR SYSTEM HAVING THE SAME

CROSS-REFERENCE TO RELATED APPLICATIONS

The present application claims priority of Korean Patent Application No. 10-2013-0083631, filed on Jul. 16, 2013, which is incorporated herein by reference in its entirety.

BACKGROUND

1. Field

Exemplary embodiments of the present invention relate to a semiconductor design technology, and more particularly, to a semiconductor device and a semiconductor system having the same.

2. Description of the Related Art

A semiconductor device (hereinafter, referred to as a "memory device") such as a Dynamic Random Access Memory (DRAM) performs a series of operations for storing or reading data according to control of a controller.

FIG. 1A is a timing diagram for explaining an operation of a memory device to store data.

Referring to FIG. 1A, when commands CMD for a first active operation ACT0, a first write operation WT0, and a first precharge operation PRE0 are sequentially applied from a controller, the memory device sequentially generates an active command ACT for the first active operation ACT0, a write command CASP for the first write operation WT0, and a precharge command PRE_CMD for the first precharge operation PRE0 at predetermined times in response to the respective commands CMD. Similarly, when commands CMD for a second active operation ACT1, a second write operation WT1, and a second precharge operation PRE1 are sequentially applied, the memory device sequentially generates an active command ACT for the second active operation ACT1, a write command CASP for the second write operation WT1, and a precharge command PRE_CMD for the second precharge operation PRE0 at predetermined times, in response to the respective commands CMD.

At this time, the memory device activates a row of a predetermined bank, for example, a word line, in response to the active command ACT, performs a write operation through a predetermined column, for example, a bit line, in response to the write command CASP, and performs an operation of precharging the predetermined bank in response to the precharge command PRE_CMD.

FIG. 1B is a timing diagram for explaining an operation of the memory device to read data.

Referring to FIG. 1B, when commands CMD for a first active operation ACT0, a first read operation RD0, and a first precharge operation PRE0 are sequentially applied from the controller, the memory device sequentially generates an active command ACT for the first active operation ACT0, a read command CASP for the first read operation RD0, and a precharge command PRE_CMD for the first precharge operation PRE0 at predetermined times, in response to the respective commands CMD. Similarly, when commands CMD for a second active operation ACT1, a second read operation RD1, and a second precharge operation PRE1 are sequentially applied from the controller, the memory device sequentially generates an active command ACT for the second active operation ACT1, a read command CASP for the second read operation RD1, and a precharge command PRE_CMD for the precharge operation PRE0 at predetermined times, in response to the respective commands CMD.

At this time, the memory device activates a row of a predetermined bank, for example, a word line, in response to the active command ACT, performs a read operation through a predetermined column, for example a bit line, in response to the read command CASP, and performs an operation of precharging the predetermined bank in response to the precharge command PRE_CMD.

The memory device operating as described above performs one operation, for example, active operation, read operation, or precharge operation, per one command CMD applied from the controller,

SUMMARY

Various exemplary embodiments are directed to a semiconductor device capable of sequentially performing a plurality of operations per a predetermined command and a semiconductor system including the same.

In accordance with an exemplary embodiment of the present invention, a semiconductor device may include a column command generation unit suitable for generating a column command delayed by a first delay time from a source command, in response to a first control signal and the source command, a bank address generation unit suitable for generating a bank address delayed by the first delay time from a bank source address, in response to the first control signal and the bank source address, a precharge command generation unit suitable for generating a precharge command delayed by a second delay time from the column command, in response to a second control signal and the column command, and a precharge bank address generation unit suitable for generating a precharge bank address delayed by the second delay time from the bank address, in response to the second control signal and the bank address.

In accordance with an exemplary embodiment of the present invention, a semiconductor system may include a controller suitable for generating access information, and a semiconductor device suitable for performing a plurality of internal operations related to each other according to predetermined scheduling, based on the access information.

BRIEF DESCRIPTION OF THE DRAWINGS

FIGS. 1A and 18 are timing diagrams for explaining operations of a conventional memory device.

DETAILED DESCRIPTION

Figure 1A:
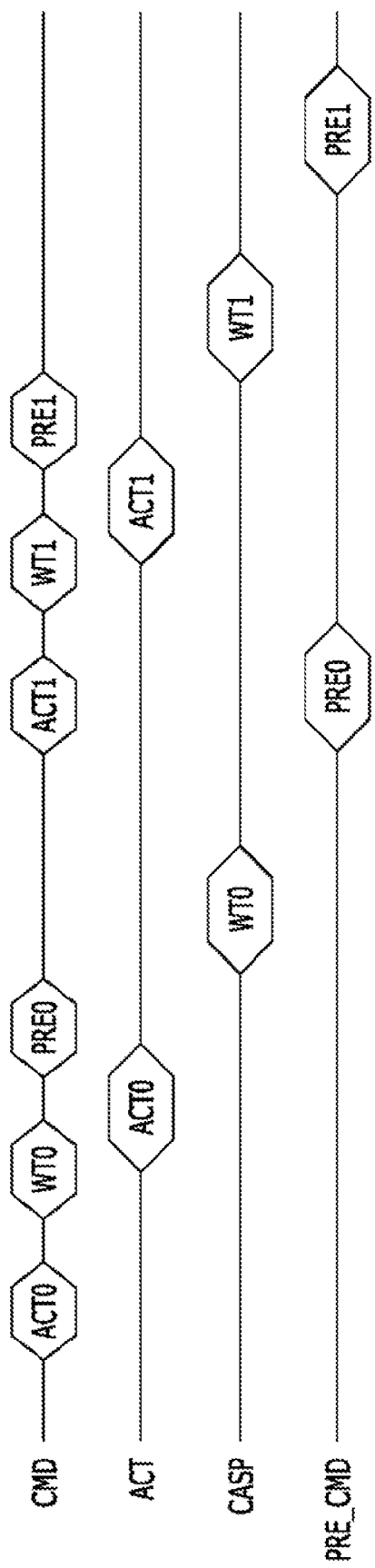
Figure 1B:
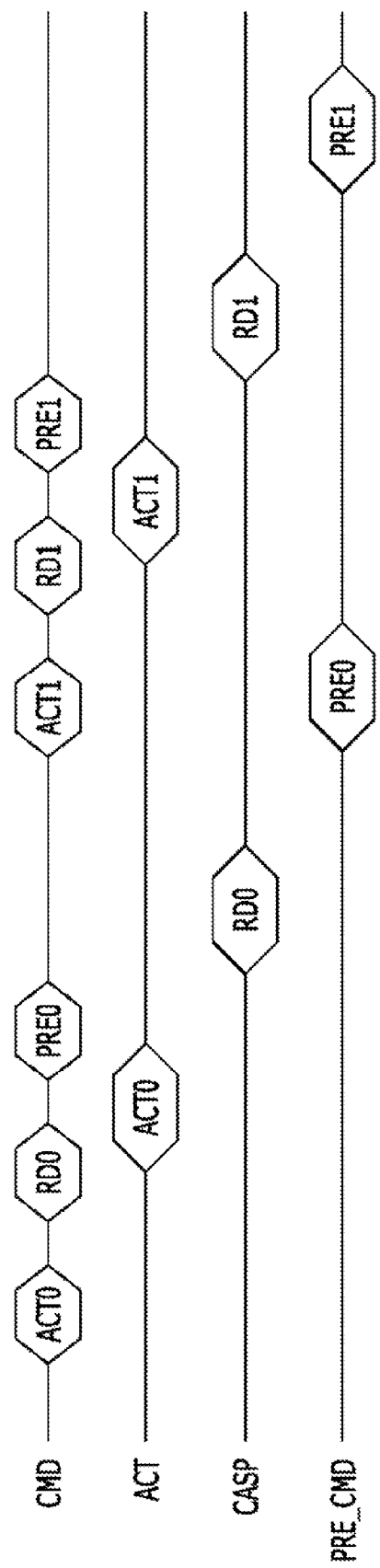

Various exemplary embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, reference numerals correspond directly to the like numbered parts in the various figures and embodiments of the present invention. It is also noted that in this specification, "connected/coupled" refers to one component not only directly coupling another component but also indirectly coupling another component through an intermediate component. In addition, a singular form may include a plural form as long as it is not specifically mentioned in a sentence.

In the exemplary embodiments of the present invention, a memory device such as DRAM will be taken as an example for describing a semiconductor device.

Figure 2:
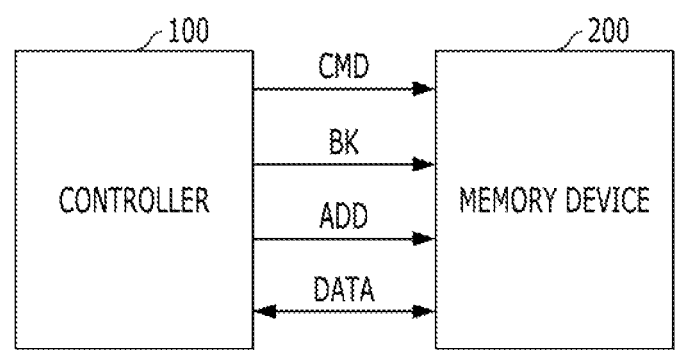
FIG. 2 is a block diagram illustrating a semiconductor system in accordance with an exemplary embodiment of the present invention.

FIG. 2 is a block diagram illustrating a semiconductor system in accordance with an exemplary embodiment of the present invention.

Referring to FIG. 2, the semiconductor system includes a controller 100 and a memory device 200. The controller 100 serves to generate a command CMD, a bank address BK, and a linear address ADD including a row address and a column address, as access information at the same time. The memory device 200 serves to perform a plurality of internal operations related to each other according to predetermined scheduling, in response to the command CMD, the bank address BK, and the linear address ADD.

The plurality of internal operations include an active operation, a column operation, and a precharge operation. For example, the memory device 200 performs an active operation for activating a row (word line) of a selected bank in response to the command CMD, the bank address BK, and the linear address ADD, performs a column operation for writing or reading data through a column (bit line) after a first delay time, and perform a precharge operation for precharging the selected bank after a second delay time. The first delay time includes RAS to CAS Delay time (tRCD), and the second delay time includes Read to Precharge time (tRTP) or Write Recovery time (tWR).

Figure 3:
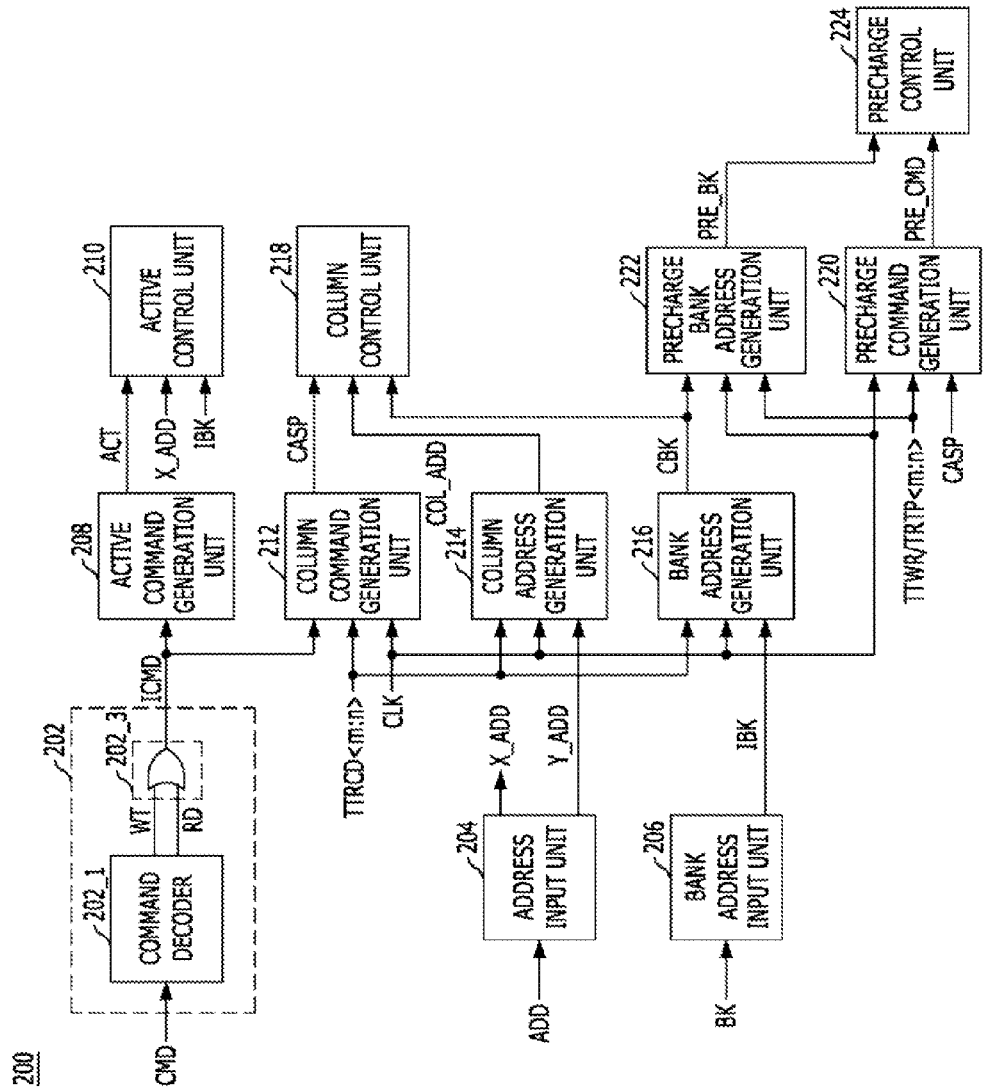
FIG. 3 is a detailed block diagram illustrating a memory device of FIG. 2.
Figure 4:
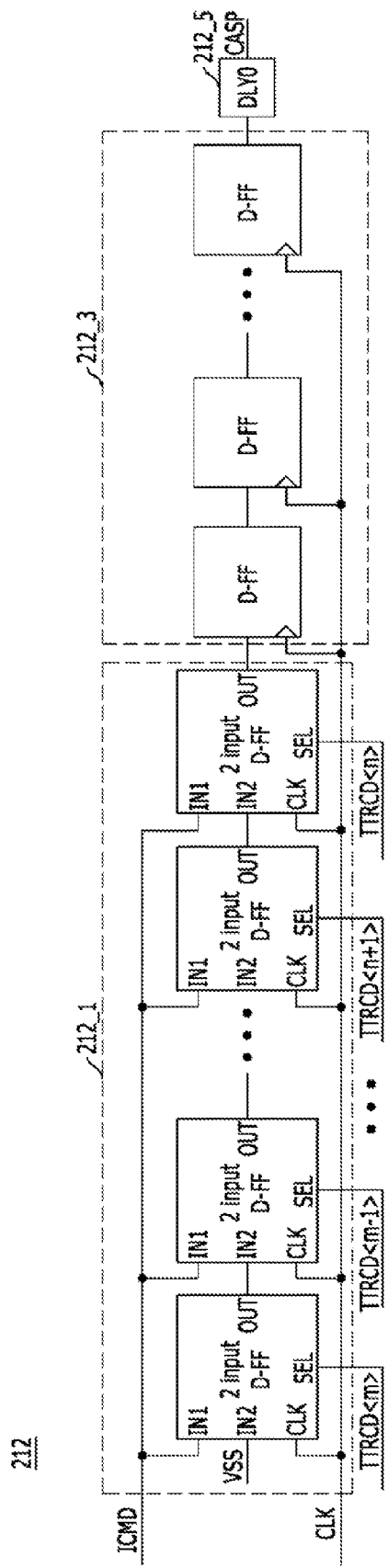
FIG. 4 is a detailed block diagram illustrating a column command generation unit of FIG. 3.
Figure 5:
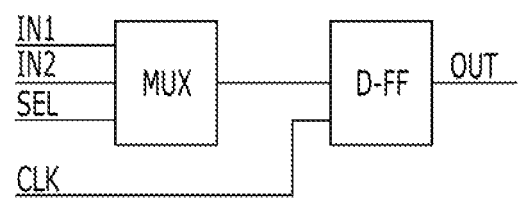
FIG. 5 is a detailed block diagram illustrating a two-input D flip-flop of FIG. 4.
Figure 6:
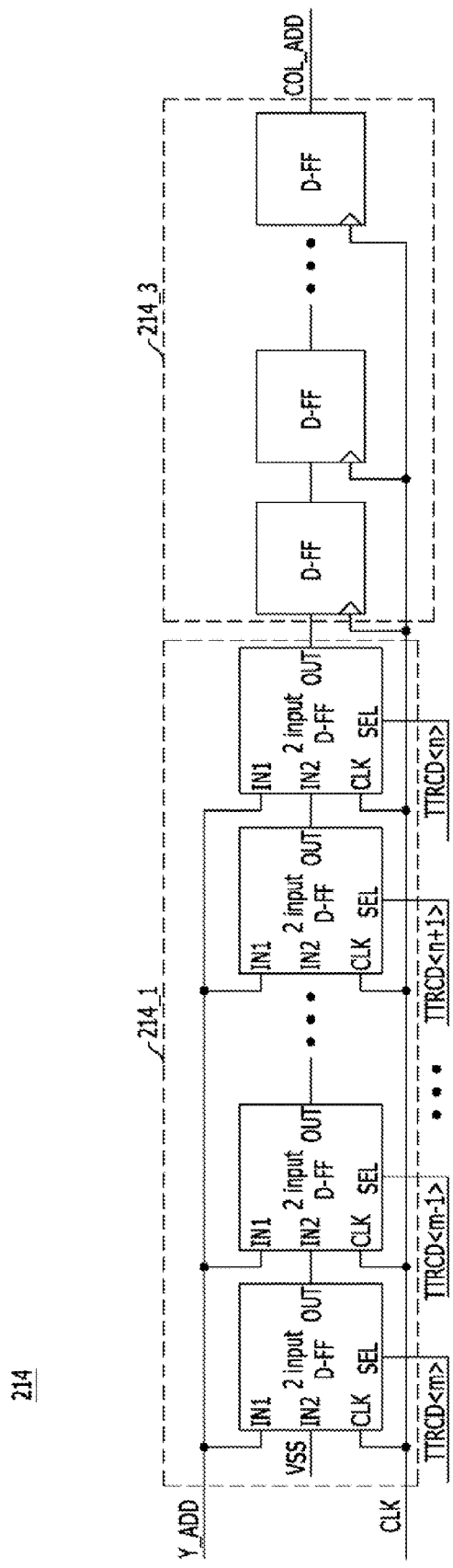
FIG. 6 is a detailed diagram illustrating a column address generation unit of FIG. 3.
Figure 7:
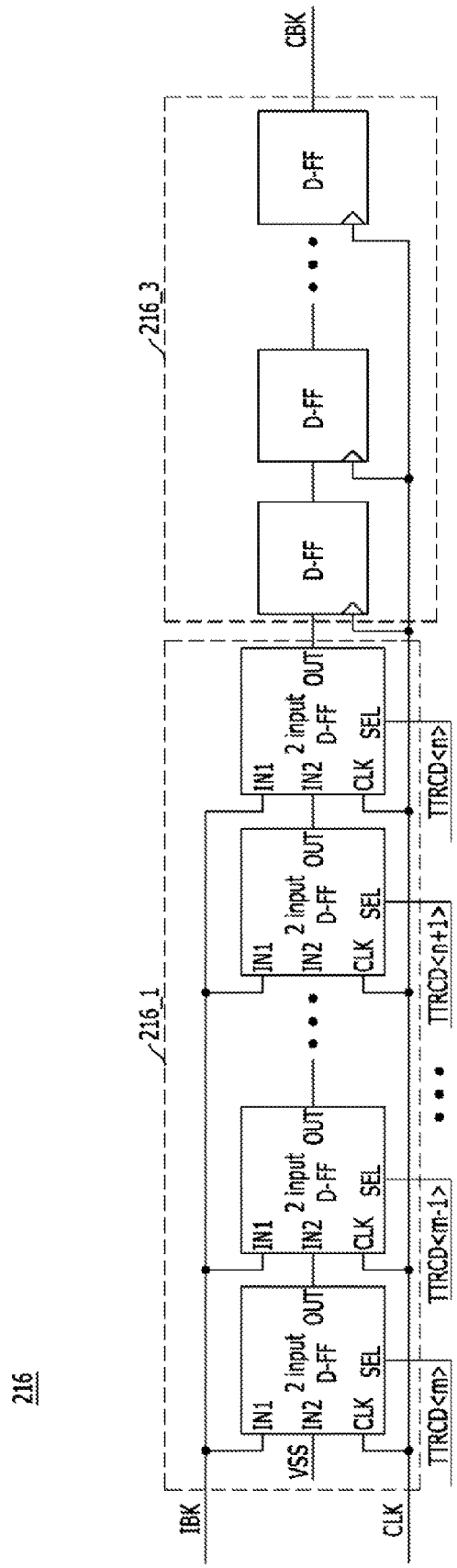
FIG. 7 is a detailed diagram illustrating a bank address generation unit of FIG. 3.
Figure 8:
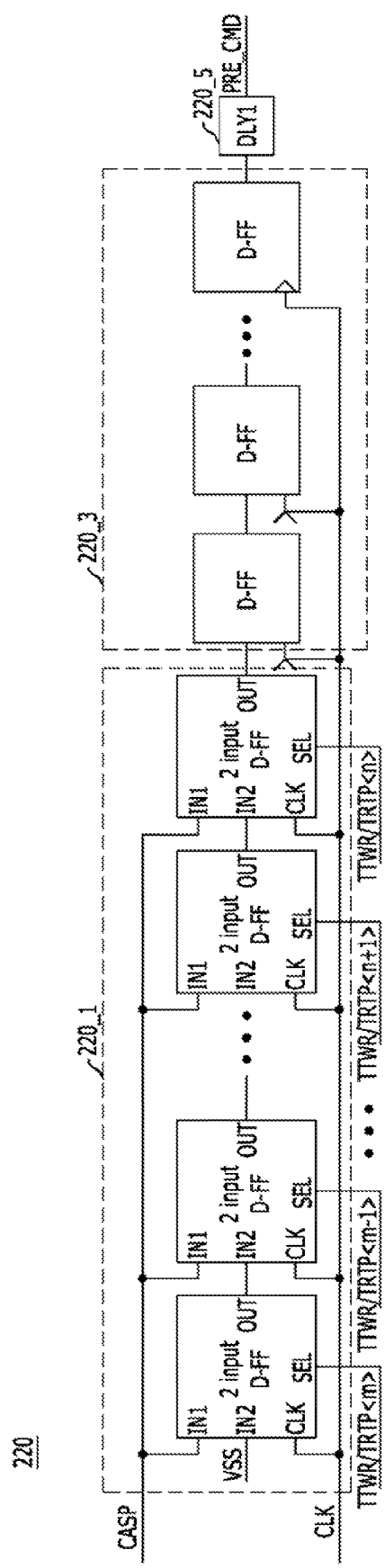
FIG. 8 is a detailed diagram illustrating a precharge command generation unit of FIG. 3.
Figure 9:
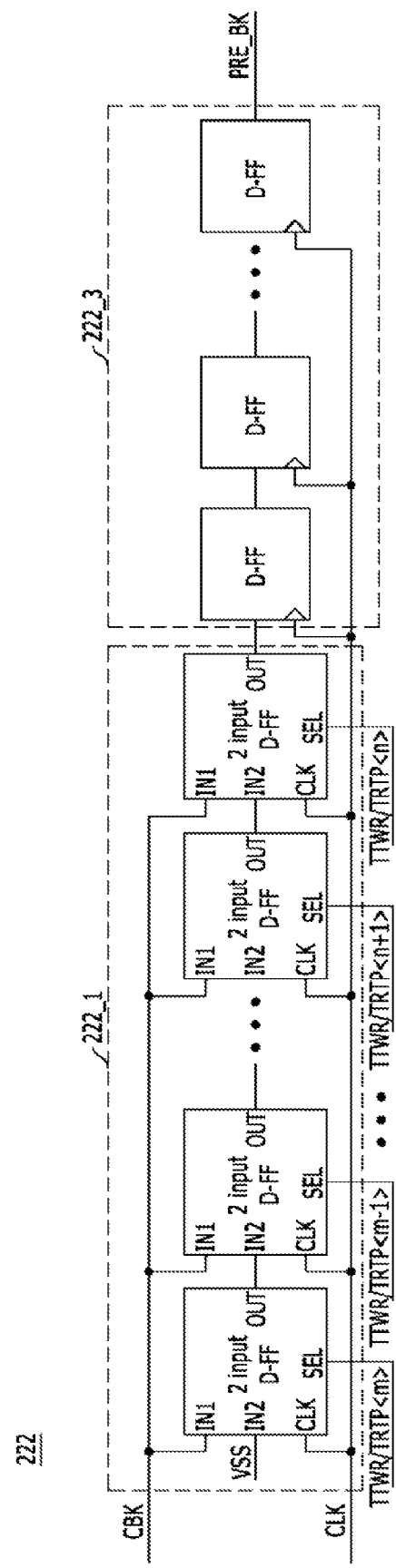
FIG. 9 is a detailed diagram illustrating a precharge bank address generation unit of FIG. 3.

FIG. 3 is a detailed block diagram illustrating the memory device 200 of FIG. 2. FIG. 4 is a detailed block diagram illustrating a column command generation unit of FIG. 3. FIG. 5 is a detailed diagram illustrating a two-input D flip-flop of FIG. 4. FIG. 6 is a detailed block diagram illustrating a column address generation unit of FIG. 3. FIG. 7 is a detailed block diagram illustrating a bank address generation unit of FIG. 3. FIG. 8 is a detailed block diagram illustrating a precharge command generation unit of FIG. 3. FIG. 9 is a detailed block diagram illustrating a precharge bank address generation unit of FIG. 3.

Referring to FIG. 3, the memory device 200 includes a command input unit 202, an address input unit 204, a bank address input unit 206, an active command generation unit 208, an active control unit 210, a column command generation unit 212, a column address generation unit 214, a bank address generation unit 216, a column control unit 218, a precharge command generation unit 220, a precharge bank address generation unit 222, and a precharge control unit 224. The memory device may further include a mode register set (MRS) suitable for generating a first control signal TTRCD<m:n> and a second control signal TTWR/TRTP<m:n>.

The command input unit 202 serves to generate a source command ICMD based on the command CMD. The address input unit 204 serves to generate a row source address X_ADD and a column source address Y_ADD based on the linear address ADD. The bank address input unit 206 serves to generate a bank source address IBK based on the bank address BK. The active command generation unit 208 serves to generate an active command ACT in response to the source command ICMD. The active control unit 210 serves to control an active operation in response to the active command ACT, the bank source address IBK, and the row source address X_ADD. The column command generation unit 212 serves to generate a column command CASP delayed by the first delay time tRCD from the source command ICMD in response to a first control signal TTRCD<m:n> and the source command ICMD. The column address generation unit 214 serves to generate a column address COL_ADD delayed by the first delay time tRCD from the column source address Y_ADD in response to the first control signal RCD<m:n> and the column source address Y_ADD. The bank address generation unit 216 serves to generate an internal bank address CBK delayed by the first delay time tRCD from the bank source address IBK in response to the first control signal TTRCD<m:n> and the bank source address IBK. The column control unit 218 serves to control a column operation in response to the column command CASP, the internal bank address CBK, and the column address COL_ADD. The precharge command generation unit 220 serves to generate a precharge command PRE_CMD delayed by the second delay time tRTP or tWR from the column command CASP in response to a second control signal TTWR/TRTP<m:n> and the column command CASP. The precharge bank address generation unit 222 serves to generate a precharge bank address PRE_BK delayed by the second delay time tRTP or tWR from the internal bank address CBK in response to the second control signal TTWR/TRTP<m:n> and the internal bank address CBK. The precharge control unit 224 serves to control a precharge operation in response to the precharge command PRE_CMD and the precharge bank address PRE_BK. The first control signal TTRCD<m:n> and the second control signal TTWR/TRTP<m:n> include a test mode signal. The command input unit 202 includes a command decoder 202_1 and a command combiner 202_3. The command decoder 202_1 decodes the command CMD. The command combiner 202_3 performs an OR operation on a write command WT and a read command RD which are outputted from the command decoder 202_1, and generates the source command ICMD.

The address input unit 204 includes a decoder decoding the linear address ADD, and the bank address input unit 206 includes a decoder decoding the bank address BK.

The column command generation unit 212 may include a shifter shifting the source command ICMD by the first delay time tRCD in response to the first control signal TTRCD<m:n> and a clock CLK. For example, referring to FIG. 4, the column command generation unit 212 may include a first variable shifting section 212_1, a first fixed shifting section 212_3, and a first delay section 212_5. The first variable shifting section 212_1 serves to shift the source command ICMD by a part of the first delay time tRCD in response to the first control signal TTRCD<m:n> and the clock CLK. The first fixed shifting section 212_3 serves to shift an output signal of the first variable shifting section 212_1 by the other part of the first delay time tRCD in response to the clock CLK. The The first delay section 212_5 delays an output signal of the first fixed shifting section 212_3 by a unit smaller than the cycle of the clock CLK and generates the column command CASP.

The first variable shifting unit 212_1 includes a plurality of two-input D flip-flops and each of the two-input D flip-flops serves to selects any one of the source command ICMD and an output signal of a previous two-input D flip-flop in response to a corresponding bit of the first control signal TTRCD<m:n>, and output the selected signal to a next two-input D flip-flop in synchronization with the clock CLK. Meanwhile, a two-input D flip-flop provided at a first stage receives a ground voltage VSS instead of an output signal of a previous two-input D flip-flop. For example, as illustrated in FIG. 5, each of the two-input D flip-flops includes a multiplexer MUX and a D flop-flop D-FF. The multiplexer MUX serves to select any one of first and second input signals IN1 and IN2 corresponding to the source command ICMD and the output signal of the previous two-input D flip-flop, respectively, in response to a select signal SEL corresponding to the respective bit of the first control signal TTRCD<m:n>. The D flip-flop serves to shift an output signal of the multiplexer MUX by one cycle (1tCK) of the clock CLK in response to the clock CLK.

Referring back to FIG. 4, the first fixed shifting section 212_3 includes a plurality of D flip-flops, and each of the D flip-flops serves to shift an output signal of a previous D flip-flop in response to the clock CLK. However, a D flip-flop provided at a first stage receives an output signal of the first variable shifting section 212_1 instead of an output signal of a previous D flip-flop.

Although not illustrated in detail, the first delay section 212_5 may include a typical delay line. For reference, the first variable shifting section 212_1 and the first fixed shifting section 212_3 may control the delay time only with a multiple of the cycle tCK of the dock CLK. Thus, as the first delay section 212_5 controls the delay time on the basis of a unit smaller than the cycle tCK of the clock CLK, the delay time may be controlled more precisely.

Referring to FIG. 6, the column address generation unit 214 may include a shifter shifting the column source address Y_ADD by the first delay time tRCD in response to the first control signal TTRCD<m:n> and the dock CLK. For example, the column address generation unit 214 may include a second variable shifting section 214_1 and a second fixed shifting section 214_3. The second variable shifting section 214_1 serves to shift the column source address Y_ADD by a part of the first delay time tRCD in response to the first control signal TTRCD<m:n> and the clock CLK. The second fixed shifting section 214_3 serves to shift an output signal of the second variable shifting section 214_1 by the other part of the first delay time tRCD in response to the clock CLK.

The second variable shifting section 214_1 includes a plurality of two-input D flip-flops, and each of the two-input D flip-flops serves to select any one of the column source address Y_ADD and an output signal of a previous two-input D flip-flop in response to a corresponding bit of the first control signal TTRCD<m:n>, and output the selected signal to a next two-input D flip-flop in synchronization with the clock CLK. However, a two-input D flip-flop provided at a first stage receives a ground voltage HISS instead of an output signal of a previous two-input D flip-flop. Since each of the two-input D flip-flops has the same configuration as described above, the detailed descriptions thereof are omitted herein (refer to FIG. 5).

The second fixed shifting section 214_3 includes a plurality of D flip-flops, and each of the flip-flops serves to shift an output signal of a previous D flip-flop in response to the clock CLK. However, a D flip-flop provided at a first stage receives an output signal of the second variable shifting section 214_1 instead of an output signal of a previous D flip-flop.

Referring to FIG. 7, the bank address generation unit 216 may include a shifter shifting the bank source address IBK by the first delay time tRCD in response to the first control signal TTRCD<m:n> and the clock CLK. For example, the bank address generation unit 216 may include a third variable shifting section 216_1 and a third fixed shifting section 216_3. The third variable shifting section 216_1 serves to shift the bank source address IBK by a part of the first delay time tRCD in response to the first control signal TTRCD<m:n> and the clock CLK. The third fixed shifting section 216_3 serves to shift an output signal of the third variable shifting section 216_1 by the other part of the first delay time tRCD in response to the clock CLK.

The third variable shifting section 216_1 includes a plurality of two-input D flip-flops, and each of the two-input D flip-flops serves to select any one of the bank source address IBK and an output signal of a previous two-input D flip-flop in response to a corresponding bit of the first control signal TTRCD<m:n>, and output the selected signal to a next two-input D flip-flop in synchronization with the clock CLK. However, a two-input D flip-flop provided at a first stage receives a ground voltage VSS instead of an output signal of a previous two-input D flip-flop. Since each of the two-input D flip-flops has the same configuration as described above, the detailed descriptions thereof are omitted herein (refer to FIG. 5).

The third fixed variable shifting section 216_3 includes a plurality of D flip-flops, and each of the D flip-flops serves to shift an output signal of a previous D flip-flop in response to the clock CLK. However, a D flip-flop provided at a first stage receives an output signal of the third variable shifting section 216_1 instead of an output signal of a previous D flip-flop.

Referring to FIG. 8, the precharge command generation unit 220 may include a shifter shifting the column command CASP by the second delay time tRTP or tWR in response to the second control signal TTWR/TRTP<m:n> and the clock CLK. For example, the precharge command generation unit 220 may include a fourth variable shifting section 220_1, a fourth fixed shifting section 220_3, and a second delay section 220_5. The fourth variable shifting section 220_1 serves to shift the column command CASP by a part of the second delay time tRTP or tWR in response to the second control signal TTWR/TRTP<m:n> and the clock CLK. The fourth fixed shifting section 220_3 serves to shift an output signal of the fourth variable shifting section 220_1 by the other part of the second delay time tRTP or tWR in response to the clock CLK. The second delay section 220_5 delays an output signal of the fourth fixed shifting section 220_3 by a unit smaller than the cycle of the clock CLK and generate the column command CASP.

The fourth variable shifting section 220_1 includes a plurality of two-input D flip-flops, and each of the two-input D flip-flops serves to select any one of the column command CASP and an output signal of a previous two-input D flip-flop in response to a corresponding bit of the second control signal TTWR/TRTP<m:n>, and output the selected signal to a next two-input D flip-flop in synchronization with the clock signal CLK. However, a two-input D flip-flop provided at a first stage receives a ground voltage VSS instead of an output signal of a previous two-input D flip-flop. Since each of the two-input D flip-flops has the same configuration as described above, the detailed descriptions thereof are omitted (refer to FIG. 5).

The fourth fixed shifting section 220_3 includes a plurality of D flip-flops, and each of the D flip-flops serves to shift an output signal of a previous D flip-flop in response to the clock CLK. However, a D flip-flop provided at a first stage receives an output signal of the fourth variable shifting section 220_1 instead of an output signal of a previous D flip-flop.

Although not illustrated in detail, the second delay section 220_5 may include a typical delay line. For reference, the fourth variable shifting section 220_1 and the fourth fixed shifting section 220_3 may control the delay time only with a multiple of the cycle tCK of the clock CLK. Thus, as the second delay section 220_5 controls the delay time with a unit smaller than the cycle tCK of the clock CLK, the delay time may be controlled more precisely.

Referring to FIG. 9, the precharge bank address generation unit 222 may include a shifter shifting the internal bank address CBK by the second delay time tRTP or tWR in response to the second control signal TTWR/TRTP<m:n> and the clock CLK. For example, the precharge bank address generation unit 222 may include a fifth variable shifting section 222_1 and a fifth fixed shifting section 222_3. The fifth variable shifting section 222_1 serves to shift the internal bank address CBK by a part of the second delay time tRTP or tWR in response to the second control signal TTWR/TRTP<m:n> and the clock CLK. The fifth fixed shifting section 222_3 serves to shift an output signal of the fifth variable shifting section 222_1 by the other part of the second delay time tRTP or tWR in response to the clock. CLK.

The fifth variable shifting section 222_1 includes a plurality of two-input D flip-flops, and each of the two-input D flip-flops serves to select any one of the internal bank address CBK and an output signal of a previous two-input D flip-flop in response to a corresponding bit of the second control signal TTWR/TRTP<m:n> and output the selected signal to a next two-input D flip-flop in synchronization with the clock CLK. However, a two-input D flip-flop provided at a first stage receives a ground voltage VSS instead of an output signal of a previous two-input D flip-flop. Since each of the two-input D flip-flops has the same configuration as described above, the detailed descriptions thereof are omitted herein (refer to FIG. 5).

The fifth fixed shifting section 222_3 includes a plurality of flip-flops and each of the D flip-flops serves to shift an output signal of a previous D flip-flop in response to the clock CLK. However, a D flip-flop provided at a first stage receives an output signal of the fifth variable shifting section 222_1 instead of an output signal of a previous D flip-flop.

Hereafter, an operation of the semiconductor system in accordance with the exemplary embodiment of the present invention will be described with reference to FIGS. 10A and 10B.

Figure 10A:
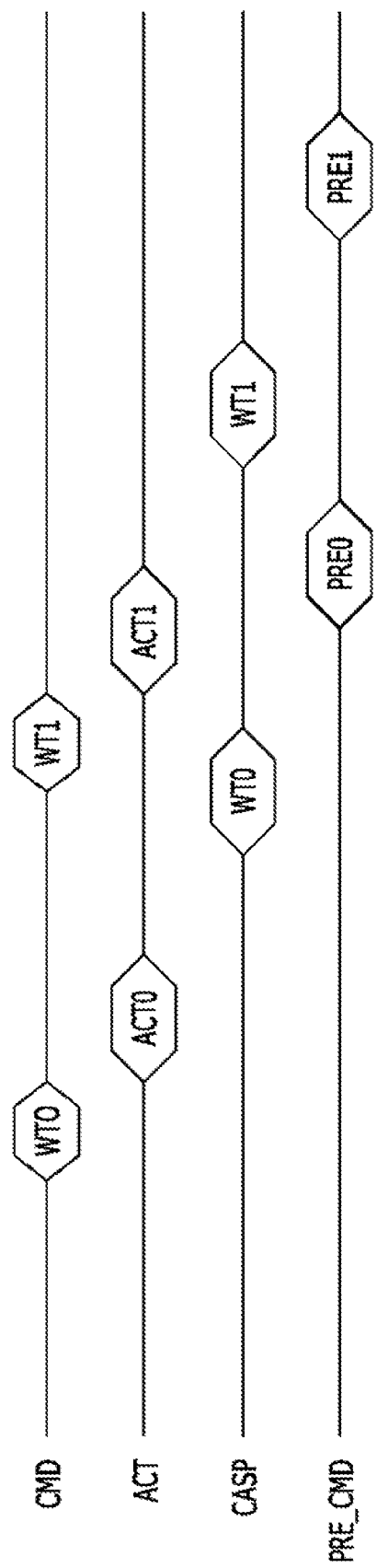
FIGS. 10A and 10B are timing diagrams for explaining operations of the semiconductor system in accordance with the exemplary embodiment of the present invention.

FIG. 10A is a timing diagram for explaining a write operation of the semiconductor system in accordance with the exemplary embodiment of the present invention. FIG. 10B is a timing diagram for explaining a read operation of the semiconductor system in accordance with the exemplary embodiment of the present invention.

Referring to FIG. 10A the controller 100 applies a command CMD related to the write operation as access information to the memory device 200. At this time, although not illustrated in detail, the controller 100 applies a bank address BK and a linear address ADD, required for the write operation, as the access information to the memory device 200 at the same time. The linear address ADD includes a row address and a column address.

The memory device 200 performs an active operation for activating a predetermined bank, performs a column operation for writing data to the activated bank after the first delay time tRCD, and performs a precharge operation for precharging the activated bank after the second delay time tWR, in response to the command CMD, the bank address BK, and the linear address ADD. This will be described in detail as follows.

The command input unit 202 generates a source command ICMD in response to the command CMD, the address input unit 204 generates a row source address X_ADD and a column source address Y_ADD in response to the linear address ADD, and the bank address input unit 206 generates a bank source address IBK in response to the bank address BK.

When the active command generation unit 208 generates the active command ACT in response to the source command ICMD the active control unit 210 controls the active operation in response to the active command ACT, the row source address X_ADD, and the bank source address IBK.

Furthermore, when the column command generation unit 212 generates a column command CASP by shifting the source command ICMD by the first delay time tRCD in response to the first control signal TTRCD<m:n> and the clock CLK, the column address generation unit 214 generates a column address COL_ADD by shifting the column source address Y_ADD by the first delay time tRCD in response to the first control signal TTRCD<m:n> and the clock CLK, and the bank address generation unit 216 generates an internal bank address CBK by shifting the bank source address IBK by the first delay time tRCD in response to the first control signal TTRCD<m:n> and the clock CLK, the column control unit 218 controls the column operation in response to the column command CASP, the column address COL_ADD, and the internal bank address CBK. Thus, it may be seen that the column operation is performed in the first delay time tRCD after the active operation is performed.

Furthermore, when the precharge command generation unit 220 generates a precharge command PRE_CMD by shifting the column command CASP by the second delay time tWR in response to the second control signal TTWR/TRTP m:n> and the clock CLK and the precharge bank address generation unit 222 generates a precharge bank address PRE_BK by shifting the internal bank address CBK by the second delay time tWR in response to the second control signal TTWR/TRTP<m:n> and the clock, the precharge control unit 224 controls the precharge operation in response to the precharge command PRE_CMD and the precharge bank address PRE_BK. Thus, it may be seen that the precharge operation is performed in the second delay time tWR after the column operation is performed.

Figure 10B:
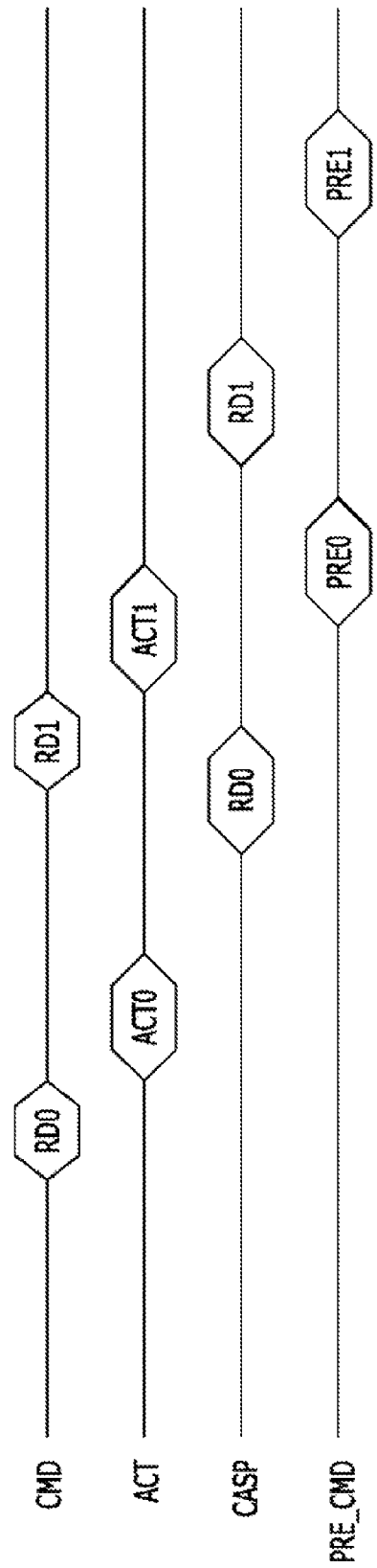

Referring to FIG. 10B, the controller 100 applies a command CMD related to the read operation as access information to the memory device 200. At this time, although not illustrated in detail, the controller 100 applies a bank address BK and a linear address ADD, required for the read operation, to the memory device 200 at the same time. The linear address ADD includes a row address and a column address.

The memory device 200 performs an active operation for activating a predetermined bank, performs a column operation for reading data from the activated bank after the first delay time tRCD, and performs a precharge operation for precharging the activated bank after the second delay time tRTP, in response to the command CMD, the bank address BK, and the linear address ADD. This will be described in more detail as follows.

The command input unit 202 generates a source command ICMD in response to the command CMD, the address input unit 204 generates a row source address X_ADD and a column source address Y_ADD in response to the linear address ADD, and the bank address input unit 206 generates a bank source address IBK in response to the bank address BK.

When the active command generation unit 208 generates the active command ACT in response to the source command ICMD, the active control unit 210 controls the active operation in response to the active command ACT, the row source address X_ADD, and the bank source address IBK.

Furthermore, when the column command generation unit 212 generates a column command CASP by shifting the source command ICMD by the first delay time tRCD in response to the first control signal TTRCD<m:n> and the clock CLK, the column address generation unit 214 generates a column address COL_ADD by shifting the column source address Y_ADD by the first delay time tRCD in response to the first control signal TTRCD<m:n> and the clock CLK, and the bank address generation unit 216 generates an internal bank address CBK by shifting the bank source address IBK by the first delay time tRCD in response to the first control signal TTRCD<m:n> and the clock CLK, the column control unit 218 controls the column operation in response to the column command CASP, the column address COL_ADD, and the internal bank address CBK. Thus, it can be seen that the column operation is performed in the first delay time tRCD after the active operation is performed.

Furthermore, when the precharge command generation unit 220 generates a precharge command PRE_CMD by shifting the column command CASP by the second delay time tRTP in response to the second control signal TTWR/TRTPM<m:n> and the clock CLK and the precharge bank address generation unit 222 generates a precharge bank address PRE_BK by shifting the internal bank address CBK by the second delay time tRTP in response to the second control signal TTWR/TRTPM<m:n> and the clock CLK, the precharge control unit 224 controls the precharge operation in response to the precharge command PRE_CMD and the precharge bank address PRE_BK. Thus, it may be seen that the precharge operation is performed in the second delay time tRTP after the column operation is performed.

In accordance with the exemplary embodiment of the present invention, a plurality of operations may be performed on the basis of access information including one predetermined command, and timings between the respective internal operations may be controlled.

Although various embodiments have been described for illustrative purposes, it will be apparent to those skilled in the art that various changes and modifications may be made without departing from the spirit and scope of the invention as defined in the following claims.

What is claimed is:

1. A semiconductor device comprising:
a column command generation unit suitable for generating a column command delayed by a first delay time from a source command, in response to a first control signal and the source command;
a bank address generation unit suitable for generating a bank address delayed by the first delay time from a bank source address, in response to the first control signal and the bank source address;
a precharge command generation unit suitable for generating a precharge command delayed by a second delay time from the column command, in response to a second control signal and the column command; and
a precharge bank address generation unit suitable for generating a precharge bank address delayed by the second delay time from the bank address, in response to the second control signal and the bank address.

2. The semiconductor device of claim 1, wherein the first delay time comprises RAS to CAS Delay time (tRCD), and the second delay time comprises Read to Precharge time (tRTP) or Write Recovery time (tWR).

3. The semiconductor device of claim 1, wherein the column command generation unit comprises:
a first variable shifting section suitable for shifting the source command by a part of the first delay time in response to the first control signal and a clock; and
a first fixed shifting section suitable for shifting an output signal of the first variable shifting section by the other part of the first delay time in response to the clock.

4. The semiconductor device of claim 3, wherein the column command generation unit further comprises:
a first delay section suitable for generating the column command by shifting an output signal of the first fixed shifting section by a unit smaller than the cycle of the clock.

5. The semiconductor device of claim 1, wherein the bank address generation unit comprises:
a second variable shifting section suitable for shifting the bank source address by a part of the first delay time in response to the first control signal and a clock; and
a second fixed shifting section suitable for shifting an output signal of the second variable shifting section by the other part of the first delay time in response to the clock.

6. The semiconductor device of claim 1, wherein the precharge command generation unit comprises:
a third variable shifting section suitable for shifting the column command by a part of the second delay time in response to the second control signal and a clock; and
a third fixed shifting section suitable for shifting an output signal of the third variable shifting section by the other part of the second delay time in response to the clock.

7. The semiconductor device of claim 6, wherein the precharge command generation unit further comprises:
a second delay section suitable for generating the precharge command by delaying an output signal of the third fixed shifting section by a unit smaller than the cycle of the clock.

8. The semiconductor device of claim 1, wherein the precharge bank address generation unit comprises:
a fourth variable shifting section suitable for shifting the bank address by a part of the second delay time in response to the second control signal and a clock; and
a fourth fixed shifting section suitable for shifting an output signal of the fourth variable shifting section by the other part of the second delay time in response to the clock.

9. The semiconductor device of claim 1, wherein the first and second control signals comprise a test mode signal.

10. The semiconductor device of claim 1, further comprising:
a mode register set (MRS) suitable for generating the first and second control signals.

11. The semiconductor device of claim 1, further comprising:
a command input unit suitable for generating the source command based on an external command;
an active command generation unit suitable for generating an active command in response to the source command;
an address input unit suitable for generating a row source address and a column source address based on an external address;
a bank address input unit suitable for generating the bank source address based on an external bank address;
a column address generation unit suitable for generating a column address delayed by the first delay time from the column source address in response to the first control signal and the column source address;

an active control unit suitable for controlling an active operation in response to the active command, the bank source address, and the row source address;

a column control unit suitable for controlling a column operation in response the column command, the bank address, and the column address; and a precharge control unit suitable for controlling a precharge operation in response to the precharge command and the precharge bank address.

12. The semiconductor device of claim 11, wherein the column address generation unit comprises:

a fifth variable shifting section suitable for shifting the column source address by a part of the first delay time in response to the first control signal and a clock; and a fifth fixed shifting section suitable for shifting an output signal of the fifth variable shifting section by the other part of the first delay time in response to the clock.

13. The semiconductor device of claim 11, wherein the command input unit comprises:

a command decoder suitable for decoding the external command; and a command combiner suitable for generating the source command according to at least any one of a write command and a read command which are outputted from the command decoder.

14. The semiconductor device of claim 11, wherein the address input unit and the bank address input unit comprise a decoder.

15. A semiconductor system comprising:

a controller suitable for generating access information including a command, a bank address, a row address and a column address; and a semiconductor device suitable for receiving the access information and sequentially performing a plurality of internal operations related to each other according to predetermined scheduling, based on the access information including the command, the bank address, the row address and the column address received from the controller, wherein the command is a single command signal, which is used in sequentially performing the plurality of internal operations related to each other.

16. The semiconductor system of claim 15, wherein the command comprises a write command or read command.

17. The semiconductor system of claim 15, wherein the plurality of internal operations comprise an active operation for activating a predetermined bank, a column operation for reading or writing data, and a precharge operation for precharging the predetermined bank, and when the access information is inputted, the semiconductor device performs the active operation, performs the column operation after a first delay time, and performs the precharge operation after a second delay time.

18. The semiconductor system of claim 17, wherein the first delay time comprises RAS to CAS Delay time (tRCD), and the second delay time comprises Read to Precharge time (tRTP) or Write Recovery time (tWR).

19. A semiconductor system comprising:

a controller suitable for generating access information; and a semiconductor device suitable for receiving the access information, and sequentially performing a plurality of internal operations related to each other according to predetermined scheduling, based on the access information, wherein the semiconductor device comprises:

a column command generation unit suitable for generating a column command delayed by a first delay time from a source command, in response to a first control signal and the source command;

a bank address generation unit suitable for generating a bank address delayed by the first delay time from a bank source address, in response to the first control signal and the bank source address;

a precharge command generation unit suitable for generating a precharge command delayed by a second delay time from the column command, in response to a second control signal and the column command; and a precharge bank address generation unit suitable for generating a precharge bank address delayed by the second delay time from the bank address, in response to the second control signal and the bank address.

20. The semiconductor system of claim 19, wherein the first delay time comprises RAS to CAS Delay time (tRCD), and the second delay time comprises Read to Precharge time (tRTP) or Write Recovery time (tWR).

* * * * *